(12) United States Patent
Mathur et al.

(10) Patent No.: US 11,468,945 B2
(45) Date of Patent: Oct. 11, 2022

(54) 3D STORAGE ARCHITECTURE WITH TIER-SPECIFIC CONTROLS

(71) Applicant: Arm Limited, Cambridge (GB)

(72) Inventors: Rahul Mathur, Austin, TX (US); Mudit Bhargava, Austin, TX (US); Joel Thornton Irby, Austin, TX (US); Andy Wangkun Chen, Austin, TX (US)

(73) Assignee: Arm Limited, Cambridge (GB)

( * ) Notice: Subject to any disclaimer, the term of this patent is extended or adjusted under 35 U.S.C. 154(b) by 146 days.

(21) Appl. No.: 17/071,449

(22) Filed: Oct. 15, 2020

(65) Prior Publication Data

US 2022/0122655 A1   Apr. 21, 2022

(51) Int. Cl.
   *G11C 11/418*     (2006.01)
   *G11C 11/419*     (2006.01)

(52) U.S. Cl.
   CPC .......... *G11C 11/418* (2013.01); *G11C 11/419* (2013.01)

(58) Field of Classification Search
   CPC ........................ G11C 11/418; G11C 11/419
   USPC ........................................................ 365/154
   See application file for complete search history.

(56) References Cited

U.S. PATENT DOCUMENTS

| | | | |
|---|---|---|---|
| 6,282,131 B1* | 8/2001 | Roy ......................... | G11C 8/12 365/230.03 |
| 6,594,748 B1* | 7/2003 | Lin ..................... | G06F 13/1689 711/170 |
| 6,788,615 B2* | 9/2004 | Becker ...................... | G11C 7/18 365/210.1 |
| 7,636,268 B1* | 12/2009 | Peng .................. | H03K 19/1776 365/206 |
| 7,752,364 B2* | 7/2010 | Oh ....................... | G06F 13/1689 710/110 |
| 8,004,912 B2* | 8/2011 | Terzioglu ............. | G06F 13/4086 365/230.06 |
| 8,423,942 B2* | 4/2013 | Werkheiser ......... | H01L 21/7684 716/54 |
| 8,604,593 B2* | 12/2013 | Schuetz .............. | H01L 25/0657 257/621 |
| 9,418,716 B1* | 8/2016 | Pallerla .................... | G11C 5/14 |
| 9,627,022 B2* | 4/2017 | Chen .................... | G11C 7/1087 |
| 9,858,217 B1* | 1/2018 | Marfatia ............... | G06F 1/3225 |
| 10,269,416 B1* | 4/2019 | Gupta .................... | H01L 23/528 |
| 2008/0253171 A1* | 10/2008 | Terada .................... | G11C 29/50 365/154 |
| 2009/0015322 A1* | 1/2009 | Flautner .............. | H01L 25/0657 29/592.1 |

(Continued)

*Primary Examiner* — Sung Il Cho
(74) *Attorney, Agent, or Firm* — Quinn IP Law

(57) ABSTRACT

A three-dimensional (3D) storage circuit includes two or more tiers of semiconductor dies, and a storage array of bitcells distributed on the two or more tiers to form a plurality of storage subarrays. One of the storage subarrays is arranged on a respective one of the tiers. Row and column replica/dummy tracking cells are arranged on each of the tiers. A timing circuit is coupled to the tracking cells of each of the tiers. In response to receipt of tier-specific trim bits for each of the tiers, the timing circuit independently controls a timing and/or voltage state of each of the tiers during an access operation of the 3D storage circuit to account for process and/or thermal variation between tiers of the 3D storage circuit.

19 Claims, 4 Drawing Sheets

(56) References Cited

U.S. PATENT DOCUMENTS

| | | | |
|---|---|---|---|
| 2013/0148402 A1* | 6/2013 | Chang | G11C 8/08 |
| | | | 365/63 |
| 2013/0163312 A1* | 6/2013 | Chang | G11C 29/56012 |
| | | | 365/156 |
| 2017/0206946 A1* | 7/2017 | Chen | G11C 17/16 |
| 2020/0194094 A1* | 6/2020 | Yang | G11C 11/4099 |

* cited by examiner

Read Timing

Write Timing

3D STORAGE ARCHITECTURE WITH TIER-SPECIFIC CONTROLS

INTRODUCTION

The present disclosure relates to integrated circuit (IC) architectures and related self-timing and voltage control methodologies. As appreciated by those of ordinary skill in the art, a three-dimensional IC (3DIC) arrangement is one in which semiconductor dies are vertically arranged in separate tiers. The tiers are coupled using wafer bonds, bump-bonding, or inter-wafer/through-die conductive vias, with such inter-tier connections referred to generally herein and in the general art as 3D connections. A tiered/3DIC arrangement reduces the overall area/footprint of an IC relative to conventional single-tier configurations, which in turn can reduce signal propagation times. However, the use of a 3DIC construction can present self-timing and other possible control challenges in certain types of ICs.

SUMMARY

At least some of the representative embodiments described herein extend a tiered/3DIC construction to a storage circuit, e.g., an SRAM (Static Random Access Memory), DRAM (Dynamic Random Access Memory), or other RAM device or memory instance. The storage circuit according to a particular embodiment includes two or more tiers of semiconductor dies. A storage array is distributed on the two or more tiers to form a plurality of memory/bitcell subarrays. That is, each storage subarray is arranged on a respective one of the tiers, with the various storage subarrays collectively forming the above-noted storage array. Replica/dummy word line (DWL)-driven tracking cells are likewise arranged on each of the tiers.

As part of this embodiment, a timing circuit is coupled to the tracking cells of each tier. The timing circuit is configured, in response to receipt of a global tracking signal, typically a global timing trigger (GTT) or a global tracking pulse (GTP), and controllable tier-specific sets of trim bits as described in detail herein, to independently control a timing and/or voltage state of each tier during an access operation of the storage circuit, i.e., a read and/or write operation. In this manner, the storage circuit is able to accurately account for propagation delays caused by predetermined inter-tier process and/or thermal variations or other inter-tier variations of the various tiers involved in executing the memory operation.

Also disclosed herein are associated methods for timing the memory operation. The method according to a representative embodiment includes providing a storage array on two or more tiers of semiconductor dies to form a plurality of storage subarrays, such that the storage subarrays are arranged on a respective one of the die tiers, i.e., one storage subarray per die tier. The method may include coupling a timing circuit to respective row and column replica/dummy tracking cells on each of the tiers. In response to receipt of a clock signal and a respective set of tier-specific trim bits for each tier, the method further includes independently controlling a timing and/or voltage state of each tier during an access operation of the storage circuit, with such control achieved doing so via the timing circuit.

A 3D storage circuit according to yet another embodiment includes control circuitry having an external clock configured to generate the above-noted clock signal, with the control circuitry also providing the tier address signal and tier-specific sets of trim bits. The storage circuit in this particular embodiment includes first and second semiconductor dies forming respective first and second tiers of the storage circuit, with the dies having respective first and second bit arrays, and also having respective first and second sets of column and row replica tracking cells. A timing circuit coupled to the control circuitry and to the tracking cells of each of the tiers is configured to generate a global tracking signal in response to a predetermined edge of the clock signal. In response to the global tracking signal, the timing circuit selectively outputs a replica or dummy word line (DWL) signal to the tracking cells of the tiers.

The storage circuit may be configured to independently modify a bit line voltage in response to at least some of the trim bits in order to control the state of each of the tiers during an access operation, and to thereby account for predetermined inter-tier process and/or thermal variations of the 3D storage circuit as noted above.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

Implementations of various techniques are described herein with reference to the accompanying drawings. It should be understood, however, that the accompanying drawings illustrate only various implementations of the present teachings, and therefore are not meant to limit the range of possible embodiments.

DETAILED DESCRIPTION

Embodiments described herein provide an efficient architecture and design methodology for incorporating two or more tiers of bitcells into a single memory instance, such that the bitcells arranged on each tier collectively form a respective storage subarray. The storage subarrays may be identically sized in some configurations, or one storage subarray may be relatively high-speed or high-density relative to the other subarray(s). As described in detail below, the tiers have a timing circuit and a respective set of trim bits, with the latter used to independently control a state of a given tier.

Figure 1:
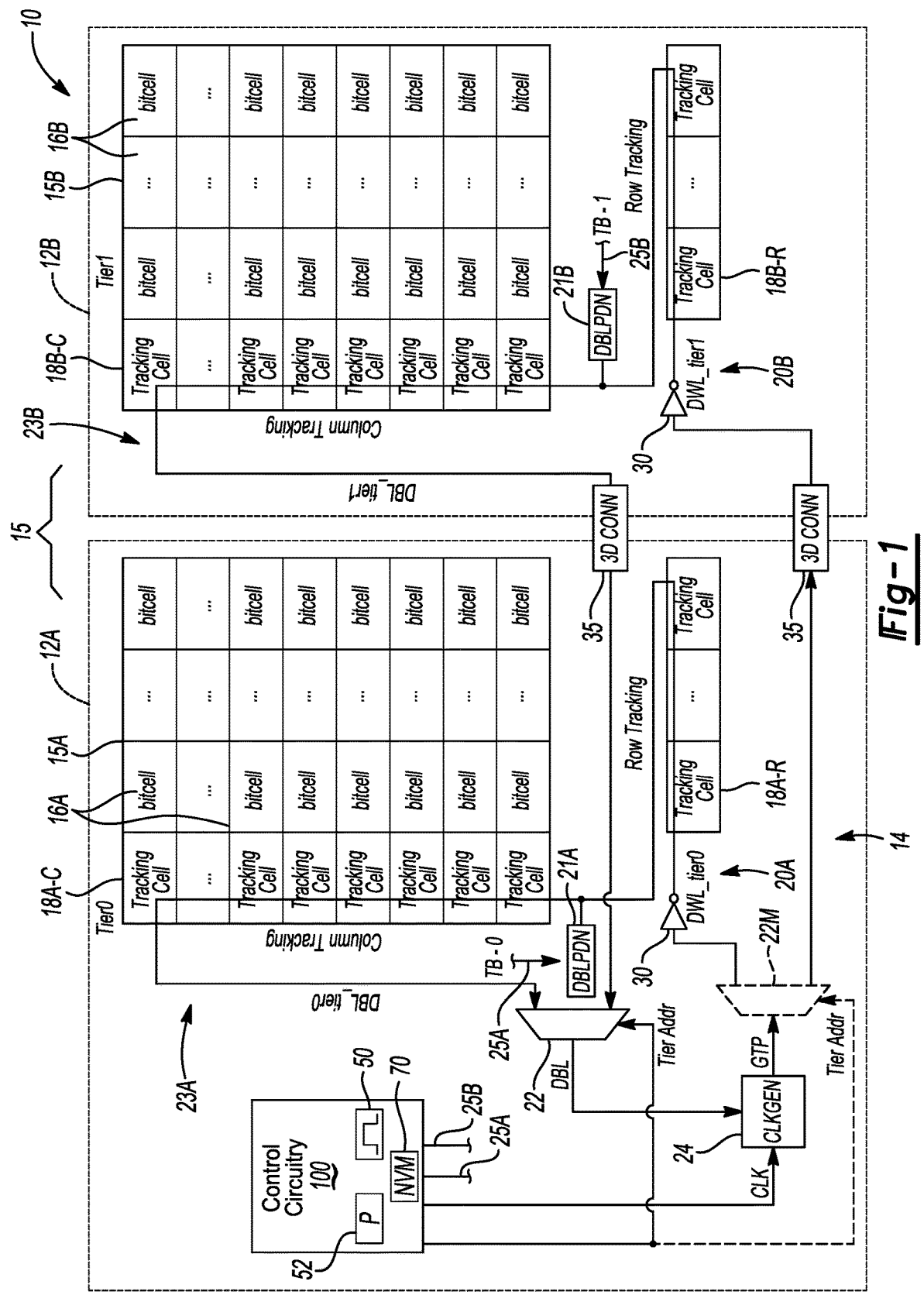
FIG. 1 illustrates a schematic circuit diagram of a three-dimensional integrated circuit (3DIC) in the form of an exemplary storage circuit.
Figure 3:
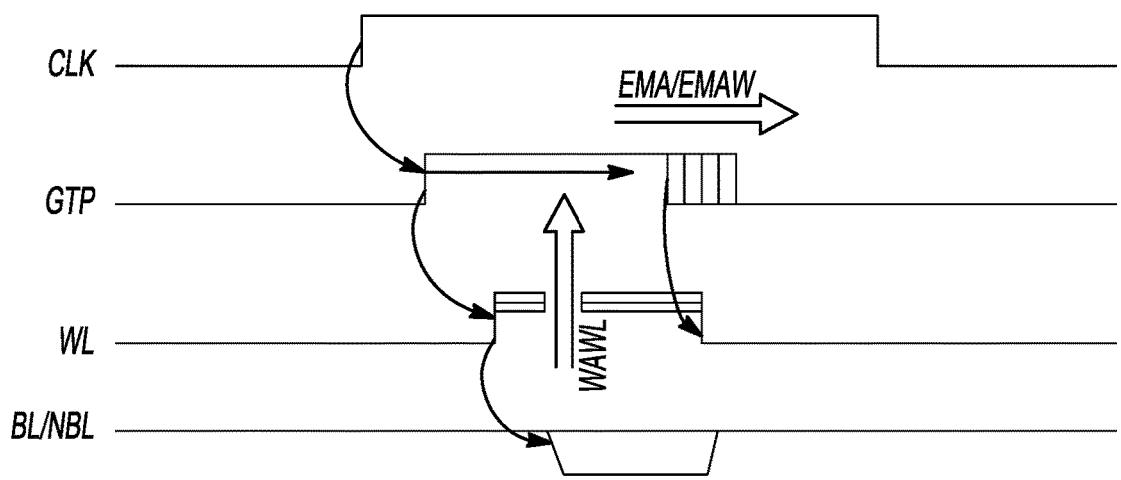
Figure 4:
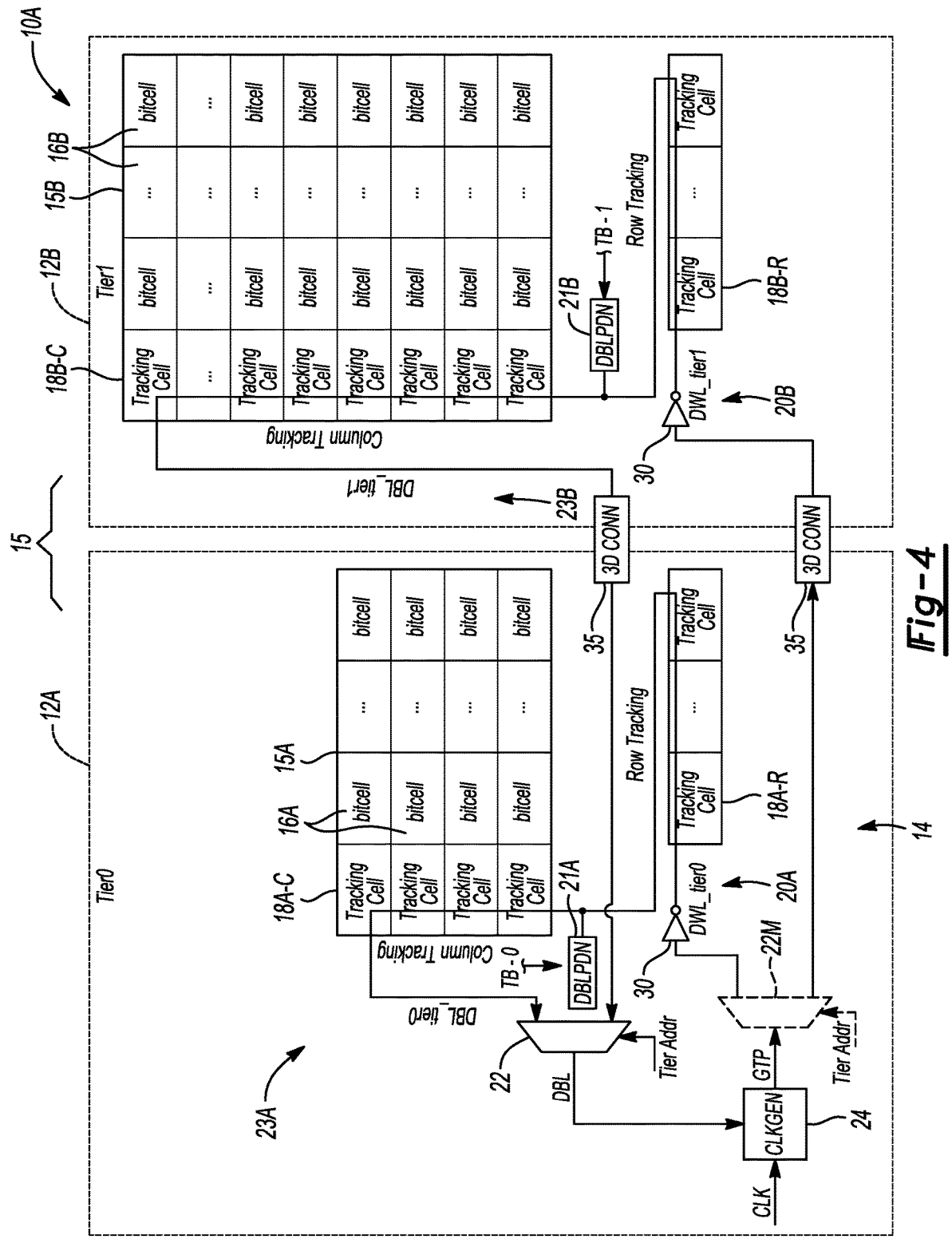
FIGS. 4 and 5 are schematic circuit diagrams of alternative embodiments of the 3DIC shown in FIG. 1.
Figure 5:
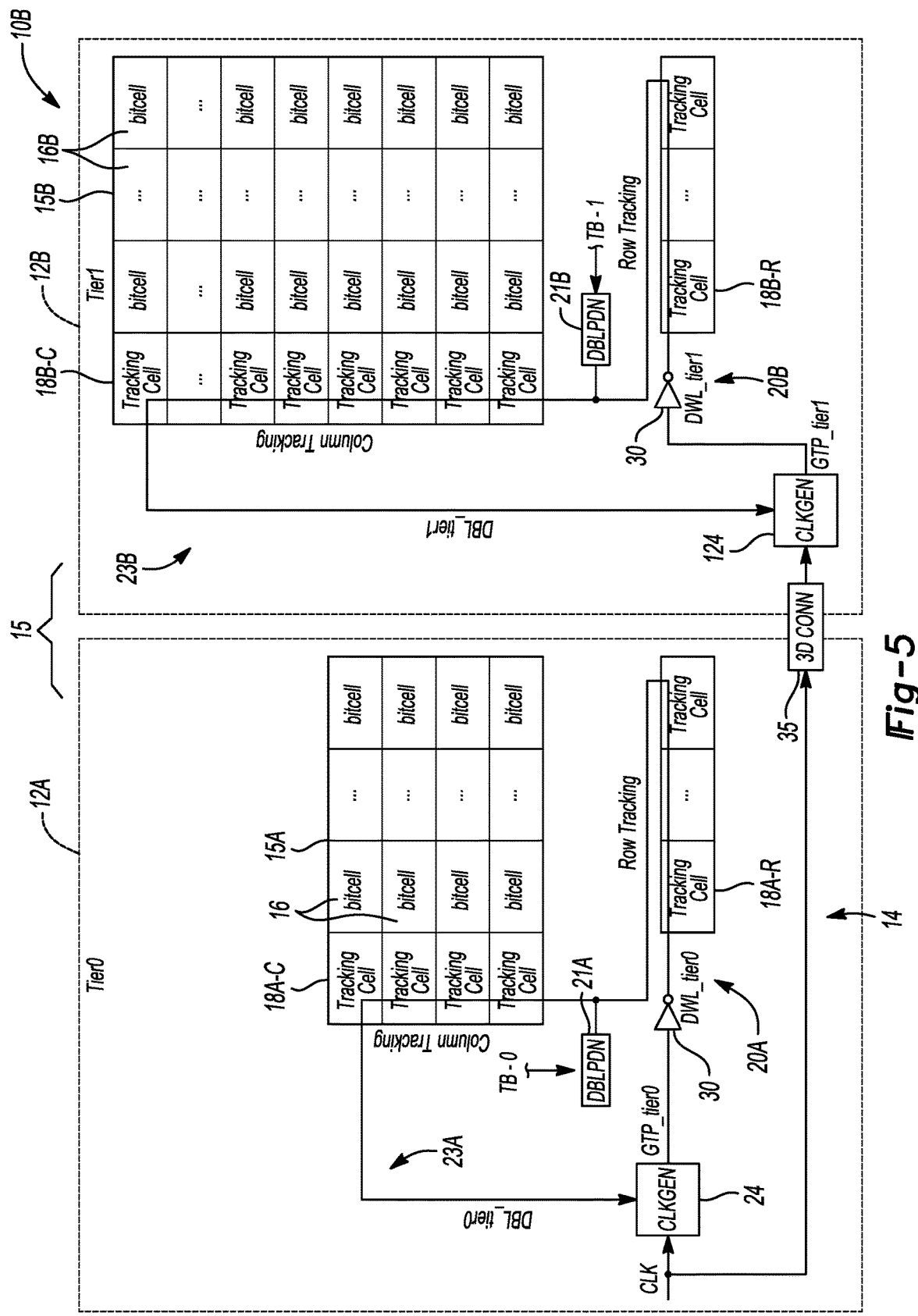

Non-limiting exemplary embodiments are provided herein for implementing a three-dimensional (3D) storage circuit 10, 10A, and 10B as shown in FIGS. 1, 4, and 5, respectively. Each implementation is controlled using digital signals, representative sets 40 and 140 of which are respectively depicted in FIGS. 2 and 3. Control of the storage circuits 10, 10A, and 10B during an access operation, i.e., a read or write operation, is optimized as set forth herein using tier-specific timing and associated circuitry, and facilitated by use of the tier-specific trim bits, which ultimately regulate timing and/or voltage levels on various bit lines as described herein.

A potential challenge to implementing a 3D construction in an SRAM or other modern storage circuit having multiple die tiers is potential thermal variations during operation and/or process variations during fabrication of the silicon or other semiconductor wafers and IC dies constructed therewith. Variations occurring in a single-tier/2D memory instance are purely local. In a 3D storage circuit of the type contemplated herein, however, i.e., one in which multiple dies are vertically arranged in ascending tiers, local variation is coupled with inter-tier variation, with the latter possibly resulting in tier-specific timing and other performance variations relative to predictions generated by a memory compiler or a model. For instance, the above-noted process and/or thermal variations can lead to differences in memory access time between the different tiers, and thus a given memory operation may take more or less than a modeled amount time to complete. A need therefore exists for optimized replica tracking and timing control of a 3D storage circuit.

In the disclosed constructions, a memory storage array is "folded", i.e., distributed or arranged across the different tiers of the storage circuit, such that each tier has a corresponding storage subarray comprising an application-specific number of bitcells. The various subarrays thus constitute a single storage array of the storage circuit. In an example scenario, timing coordination errors may lead to imprecise control decisions related to the timing of precharge bit line amplification. The above-noted tier-to-tier and/or wafer-to-wafer variations possibly leading to such errors are therefore countered herein by the use of tier-specific trim bits and independent timing circuits, which collectively provide a unique ability to control delays and/or voltage differences during critical memory operations or during specified power modes. Implementations will now be described with reference to the various Figures to illustrate the present teachings, without limiting the scope of the disclosure to the illustrated examples.

Storage circuits 10, 10A, and 10B of respective FIGS. 1, 4, and 5 may be implemented as an IC with various types of memory circuitry, e.g., random access memory (RAM) such as SRAM, DRAM, and/or any other types of volatile memory or non-volatile memory. The storage circuits 10, 10A, and 10B may be implemented as an 3D memory IC with single and/or dual rail memory architectures, and may be integrated with computing circuitry and related components on a single chip, or in an embedded system for various types of electronic, mobile, vehicular, and/or biometric applications.

The storage circuits 10, 10A, and 10B of FIGS. 1, 4, and 5 include a storage array that is folded, spread, or otherwise distributed across multiple different semiconductor die tiers, e.g., representative first and second tiers 12A and 12B (Tier0 and Tier1, respectively), to form multiple storage subarrays 15A and 15B. Thus, the terms "die" and "tier" are used interchangeably herein. Each storage subarray 15A and 15B has a corresponding set of bitcells 16A and 16B. Any number of bitcells 16A and 16B may be envisioned within the scope of the disclosure, and therefore the storage subarrays 15A and 15B are depicted in a simplified form for illustrative clarity. The storage circuits 10, 10A, and 10B also include associated timing circuitry 14, and include or are coupled to control circuitry 100. The timing circuitry 14 and the control circuitry 100 cooperate to write data to the individual bitcells 16A and/or 16B or to retrieve/read data therefrom depending on the present cycle of the access operation.

With respect to the control circuitry 100, this element is depicted as being separate from the storage circuit 10, 10A, and 10B for illustrative clarity. Embodiments may be envisioned in which the control circuitry 100 and the storage circuit 10, 10A, or 10B are fully integrated, e.g., as a System on a Chip (SOC). Regardless of whether the functional units of the control circuitry 100 are integrated into a single component or distributed as shown, the control circuitry 100 includes an oscillator or external clock 50, a non-volatile memory (NVM) 70 loaded with tier-specific trim bits TB-0 and TB-1 stored thereon, and a processor (P) 52, e.g., one or more processing cores. While omitted for simplicity, the control circuitry 100 may also include functional units that may be shared between the tiers 12A and 12B, such as but not limited to input amplifiers, latches, decoders, etc.

As will be readily appreciated by those of ordinary skill in the art, the bitcells 16A and 16B of each respective tier 12A and 12B are organized into an application-specific number of rows and columns, and thus each storage subarray 15A and 15B forms a grid of an appropriate size for the intended memory application. Logic flip-flops, latches, or storage capacitors internal to the individual bitcells 16A and 16B store therein a digital bit, i.e., a logical "1" or "0". The various bitcells 16A and 16B are coupled by word lines and pairs of complementary bit lines, with such word lines being well understood in the art. Likewise omitted for simplicity and clarity, one or more sense amplifiers may be coupled to the bit lines and used to selectively amplify the bit line signals to a recognizable logic level, thereby allowing a given data bit to be properly interpreted by logic outside of the storage array 15. Timing control of such sense amplification is described below as part of the present teachings.

The following description of FIG. 1 applies to the alterative configurations of FIGS. 4 and 5 unless otherwise noted. The 3D storage circuit 10 of FIG. 1 includes a plurality of semiconductor die tiers, i.e., first and second tiers 12A and 12B and possibly additional tiers (not shown), and the timing circuit 14. Portions of the timing circuit 14 are shared between the die tiers 12A and 12B in the FIG. 1 and FIG. 4 embodiments, with FIG. 5 implementing separate timing circuits 14 as explained below. The storage circuit 10 may be optionally embodied as a 3D SRAM device, with SRAM being a particular memory instance which may benefit from the present teachings. Such a memory instance may be part of a memory hierarchy, such as a cache, or in other beneficial memory applications.

Two die tiers 12A and 12B are depicted in a simplified plural arrangement and respectively labeled as Tier0 and Tier1, as noted above, with the tiers 12A and 12B coupled by 3D connections ("3D CONN") 35, e.g., wafer bonds or inter-wafer conductive vias. However, more than the two die tiers may be used in other embodiments. Thus, reference to the first and second die tiers 12A and 12B is not intended to limit the related teachings to only two die tiers. Regardless of the actual number of tiers used in an implementation of the present teachings, each of the die tiers 12A and 12B includes a corresponding one of the storage subarrays 15A or 15B. In the depicted embodiment, the storage subarrays 15A and 15B are the same size, and thus have the same number of rows and columns of bitcells 16A or 16B. The number of bitcells 16A in storage subarray 15A therefore exactly matches the number of bitcells 16B in storage subarray 15B.

Alternatively, as shown in FIGS. 4 and 5 the storage subarrays 15A and 15B may be different sizes/densities, i.e., the number of bitcells 16B may exceed the number of bitcells 16A, or vice versa. As will be appreciated, a storage subarray 15A or 15B having a higher density of individual bitcells 16A or 16B is referred to in the art as a "high-density". In some embodiments, the processor 52 may independently access the differently-sized storage subarrays 15A and 15B, while in other embodiments the storage subarrays 15A and 15B may share the same address space. Such an arrangement may be of particular benefit in an architecture in which critical or frequently-accessed data is stored on a lowermost storage subarray, e.g., in Tier0, as such data could be accessed with faster timing and lower power consumption. In a possible arrangement, the storage subarray 15B may be arranged on an uppermost one of the two or more semiconductor die tiers, i.e., Tier1 or a vertically-uppermost/highest tier, and may constitute a high-density storage subarray 15B.

As part of the tier-specific function and independent control enabled by the present disclosure, the timing circuit 14 includes a respective plurality of replica/dummy cells, referred to herein as dummy tracking cells 18A-R (rows), 18A-C (columns), 18B-R (rows), or 18B-C (columns). The timing circuit 14 forms corresponding self-timing paths for each tier 12A and 12B, inclusive of replica or dummy word line (DWL) paths 20A and 20B and replica/dummy bit line (DBL) paths 23A and 23B, representing signal propagation along a dummy word or bit line for respective column and row tracking in the respective storage array 15A or 15B. As will be appreciated, a self-timing path may be tuned or calibrated for a respective storage array 15A or 15B, e.g., in response to a built-in self-test (BIST) process, to provide timing that closely tracks Process-Voltage-Temperature (PVT) variations, as well as to provide a sufficient timing margin to account for the slowest bitcell 16A or 16B in the respective storage array 15A or 15B. The trim bits TB-0 and TB-1 may then be recorded in NVM 70 and directed to the appropriate tier 12A or 12B in controlling the storage circuit 10 during a memory operation.

Each storage circuit 10, 10A, or 10B is in communication with the external clock 50, shown for simplicity as part of the control circuitry 100 in FIG. 1. The external clock 50 generates an external clock signal CLK as a digital pulse, which in turn is transmitted to a local clock generator (CLKGEN) 24 within the timing circuit 14, with the clock generator 24 serving as the memory internal clock, as is well understood in the art.

In the representative embodiments of FIGS. 1 and 4, a single local clock generator 24 is shared by the first and second tiers 12A and 12B, while in FIG. 5 each tier 12A and 12B has a respective local clock generator 24 or 124. Thus, FIG. 5 foregoes use of the N:1 demultiplexer 22 and the multiplexer 22M shown in FIGS. 1 and 4, and instead generates tier-specific local tracking signals, e.g., GTP tier0 and GTP tier1. In response to the clock signal CLK, typically a rising edge thereof but not necessarily so, the local clock generator 24 outputs the global tracking signal, in this instance an exemplary global tracking pulse (GTP), alternatively a global tracking trigger (GTT) as understood in the art, with exemplary signals 40 and 140 respectively shown in FIGS. 2 and 3 and described below. For instance, when the external clock signal CLK is asserted HIGH to begin a read or write operation, the local clock generator 24 may initiate the GTP and provide the same to various functional units of the storage circuit 10 as set forth below, possibly including pre-charging bit lines and enabling column access drivers and read/write controllers. A rising or a falling edge may be used to track internal timing, e.g., with a Global Tracking Pulse (GTP) used in some embodiments for this purpose within the intended scope of GTT as used herein.

As appreciated in the art, memory Self Time Paths (STPs) typically include a Dummy (replica) Word. Line (DWL) driver 30, e.g., an inverter as shown, which mimics an actual Word Line (WL) driver (not shown). STPs also include replica or dummy tracking cells such as those shown at 18A-R, 18A-C, 18B-R, and 18B-C, which are configured to match actual WL and BL parasitic loads, and Dummy Bit Line (DBL) down (DBLPL)) circuitry which mimics bitcell pulldown transistors (not shown). The replica/dummy tracking cells are each configured in a fixed state so that a DBL signal is pulled up or down on each read/write cycle, depending on the particular convention. For instance, when the control circuitry 100 senses that the DBL signal has been pulled LOW, a reset signal (not shown) may be de-asserted, followed by de-assertion of the DWL and WL signals, with subsequent sense amplifier enable (SAE) assertion (see FIGS. 2 and 3).

The memory internal clock is thus provided in some instances by the GTP whose rising edge may be based off the rising edge of the external clock signal (CLK), and whose falling edge is based on DBL fall, which in turn signals the end of a given memory operation. This approach is configured as set forth herein to provide tier-specific timing control of such a process, via the use of replica tracking cells on each tier 12A and 12B, the DWL driver 30, and in the illustrated embodiments, using an optional multiplexer 22M which sends the global tracking signal to the DWL driver 30 of the appropriate tier 12A or 12B. The multiplexer 22M may be omitted such that the global tracking signal, e.g., GTP, alone is fed to the various tracking cells of both tiers. When the multiplexer 22M is used, the DWL driver 30 does this in FIGS. 1 and 4 in part based on a decoded address signal (Tier Addr) from the control circuitry 100, which identifies the appropriate tier 12A or 12B and the particular memory row and column being accessed. The alternative embodiment of FIG. 5 foregoes the demultiplexer 22 and the multiplexer 22M in favor of tier-specific local clock generators 24 and 124 alternative output bit routing as explained below, Each DWL driver 30 responds by outputting a corresponding DWL signal, i.e., DWL tier0 and DWL tier1.

The timing circuit 14 of FIG. 1 is in communication with each of the first and second die tiers 12A and 12B, and is configured, in response to a respective set of trim bits (arrow TB-0, TB-1) transmitted via a corresponding trim bit bus 25A or 25B (shown as a broken line from the control circuitry 100 for illustrative clarity) to corresponding replica/dummy bit line pulldown circuit (DBLPDN) 21A or 21B, to independently control one or more values or logical, timing, and/or voltage states of each of the die tiers 12A and 12B during an access memory operation. Use of the trim bits TB-0 and TB-1 and their effect on tuning the timing and/or line voltage levels is described in more detail below with reference to FIGS. 2 and 3.

In the illustrated non-limiting embodiment of FIGS. 1 and 4, a single timing circuit 14 is coupled to the semiconductor die tiers 12A and 12B, and is configured to independently control the access operations of the storage subarrays 15A or 15B in response to the aforementioned trim bits, as well as the external clock signal (CLK) and tier address signal (Tier Addr) from the control circuitry 100. The timing circuit 14 may include the N:1 demultiplexer 22 as shown, in which N represents a number of the two or more semiconductor die tiers 12A and 12B. Thus, N=2 in the non-limiting simplified embodiment of FIG. 1. The demultiplexer 22 is configured to output a DBL signal to the clock generator 24, with the optional multiplexer 22M feeding the global tracking signal (GTP or GTT) and tier address signal (Tier Addr) to the replica/dummy tracking cells 18A-R, 18A-C, 18B-R, or 18B-C.

The timing circuit 14 in the exemplary FIG. 1 embodiment also includes a single/shared local clock generator 24.

Figure 2:
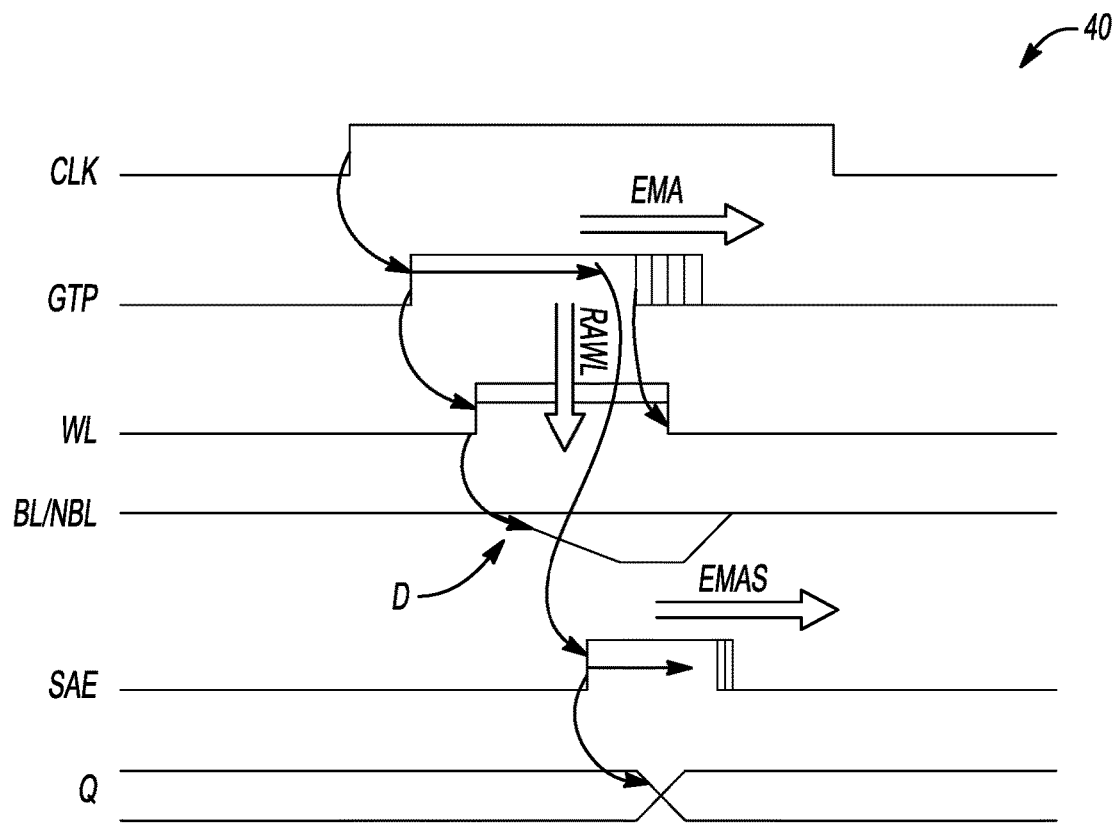
FIGS. 2 and 3 illustrate a simplified set of signals used in the control of the 3DIC architecture of FIG. 1 during respective read and write timing sequences.

The local clock generator 24 may be configured to generate a global tracking signal, e.g., a global tracking pulse (GTP) or a global tracking trigger, in response to the external clock signal (CLK), with both signals also depicted in FIGS. 2 and 3. The storage circuit 10 may include the above-noted DBLPDN circuits 21A and 21B each coupled to the plurality of replica/dummy tracking cells 18A or 18B of a respective tier 12A or 12B. In turn, the DBLPDN circuits 21A and 21B are individually and independently controlled via the trim bits TB-0 and TB-1, e.g., via a corresponding trim bit bus line 25A or 25B from the control circuitry 100. DBLPDN circuits 21A and 21B in some embodiments may be integrated with the control circuitry 100, or as a resident or external control chip or IC.

FIGS. 2 and 3 illustrate control values for the storage circuit of FIGS. 1, 4, and 5 during representative read and write timing sequences, respectively. The external clock pulse (CLK) is received by the storage circuit 10, 10A, or 10B. The rising edge of the CLK signal triggers the global tracking signal, which itself acts as the internal clock of the storage circuit 10, 10A, or 10B to initiate subsequent memory functions. A given memory operation completes within the duration or pulse width of the global tracking signal, which itself terminates within the falling edge of the CLK signal.

Bit line (BL) signals are also depicted in FIGS. 2 and 3, with the BL signals being selectively amplified or pulled-up by a sense amplifier (not shown) during pre-charge in which a state of the sense amplifier is responsive to a sense amplifier enable (SAE) signal. The timing circuit 14 is thus configured to provide sufficient time to perform amplification given the above-noted BIST-captured variation of the different tiers, and to ensure sufficient time to complete the memory operation within the GTT duration.

FIG. 2 depicts signals 40 used during a representative read timing sequence, with arrows A collectively depicting sequential progression, e.g., the rising edge (RE) of the external clock signal (CLK) triggers the global tracking signal, etc. Also depicted are traces representing the word line (WL), negative bit line (NBL), sense amplifier enable (SAE) signal, and the outputs (Q). As will be appreciated, the word line (WL) provides access to enabled bitcells 16A and/or 16B in the storage subarrays 15A and/or 15B of FIGS. 1, 4, and 5, and is used to determine whether a given bitcell 16A or 16B should be coupled to the bit line. The negative bit line (NBL) may be used during write assist operations, e.g., to pull a bit line voltage negative and thereby increase the gate-to-source voltage of a pass transistor (not shown) of the bitcell 16A or 16B. This in turn allows the affected bitcell 16A or 16B to complete the write operation in a timely manner.

As will be appreciated by those of ordinary skill in the art, the bit line voltage may deviate from the NBL voltage during a memory operation, e.g., as a strong function of transistor strength. Such deviation commences in a region generally indicated by arrow D in FIG. 2. The timing circuits 14 are thus used in part to determine precisely when to activate or fire the sense amplifier during a pre-charge operation and thereby pull up the BL. As will be appreciated, sense amplifiers may be coupled to respective pairs of complementary bit lines and used to sense low power signal swings on the bit lines, with such swings representing a data bit stored within an individual bitcell 16A and 16B. Upon amplifying the low power signal swings to a recognizable logic level, output bits (Q) may be properly interpreted by the control circuitry 100 or other external and/or internal circuitry.

The trim bits TB-0 and TB-1 shown in FIGS. 1, 4, and 5 may vary depending on the embodiment. As depicted schematically, any or all of the following example trim bits may be captured in NVM 70 of the control circuitry 100, e.g., upon BIST completion, and thereafter used to provide a desired level of functionality. Delays within the timing circuit 14 for the respective tiers 12A and 12B may be affected using extra margin adjust (EMA) trim bits. EMA trim bit variations include EMA sense (EMAS) and EMA write (EMAW) bits (FIG. 3) in some embodiments.

Historically, EMA inputs for use in memory devices included static address bits set to default/design point values and used to control timing of sense amps and/or write word lines. Use of EMA trim bits as set forth herein, however, allows for tier-specific timing adjustments within the storage circuit 10. As used herein, tier-specific EMA trim bits are provided to control an edge of the GTT, e.g., a falling edge as indicated by arrow EMA in FIG. 2, indicating possible expansion of an exemplary GTP pulse width. EMA trim bits are thus used to control the delay between a rising edge of the non-limiting GTP at the start of a memory operation to the onset of a reset event, with such a delay directly controlling sense enable delay. EMAS bus signals may be used to control the duration for which the sense enable (SAE) is transitioned HIGH and the sense amplifier (not shown) is thereby turned ON (FIG. 2). EMAW on the other hand controls timing of a reset delay during a write operation (FIG. 3). Thus, each tier 12A and 12B shown in FIGS. 1, 4, and 5 may be independently controlled via a corresponding trim bit bus and additional pins (not shown).

In some embodiments, the trim bits TB-0 and TB-1 used by the timing circuit 14 may also include read-assist word line (RAWL) (FIG. 2) and write assist word line (WAWL) trim bits (FIG. 3). As used herein, RAWL provides voltage adjustment controls to the word line voltage fed by a local voltage supply during a read cycle, i.e., for performing a read assist function. In turn, WAWL (FIG. 3) and possibly write assist bit line (WABL) (not shown) are voltage adjustment controls on the write-line and bit line voltages, respectively, for providing write assist during a write cycle.

In another embodiment, the 3D storage circuit 10, 10A, or 10B may include the control circuitry 100 of FIG. 1, possibly including the external clock 50, with the control circuitry 100 also outputting the tier address signals in the embodiments of FIGS. 1 and 4, and the tier-specific sets of user-controllable trim bits (arrows TB-0, TB-1). In a simplified configuration, the storage circuit 10, 10A, or 10B includes a first semiconductor die forming a first die tier 12A of the storage circuit, and having a first bit array 15A, and respective first sets of column and row replica/dummy tracking cells 18A-C and 18A-R. Row/column tracking is shown in the various Figures as passing through all of the tracking cells 18A-C, 18B-C, 18A-R, and 18B-R for simplicity, although passage through fewer than all of the tracking cells may be used in other embodiments, e.g., for a faster tracking response. A second semiconductor die is coupled to the first semiconductor die via 3D connections, thereby forming a second tier 12B of the storage circuit 10, 10A, or 10B. The second die also includes a second bit array 15B and respective second sets of column and row replica tracking cells, i.e., 18B-C and 18B-R. Thus, the terms "die" and "tier" are used interchangeably herein.

In this embodiment, a timing circuit 14 is coupled to the control circuitry 100 and to the replica tracking cells 18A-C, 18A-R, 18B-C, and 18B-R of each of the tiers 12A and 12B. The timing circuit 14 is configured to generate a GTP or other suitable global tracking signal for tracking internal timing, in response to a particular edge of the clock signal CLK. In response to the tracking signal and the tier address signal, the timing circuit 14 selectively outputs a dummy word line (DWL) signal to the replica/dummy tracking cells.

The timing circuit 14 is thus configured to independently modify a bit line voltage in response to at least some of the tier-specific trim bits (arrows TB-0, TB-1) to thereby independently control a respective timing state of each of the tiers 12A and 12B during an access operation of the storage circuit 10, 10A, or 10B, and to thereby account for predetermined inter-tier process and/or thermal variations. As with the earlier-described embodiments, the storage circuit 10, 10A, or 10B may be configured to selectively boost or collapse a corresponding local voltage supply of the identified storage subarray 15A or 15B via at least some of the tier-specific trim bits (arrows TB-0, TB-1) to thereby reduce dynamic power consumption, and/or independently transition one of the tiers 12A or 12B, e.g., an idle or unused tier 12A or 12B for a given read or write cycle or extended series thereof, to a low-power mode to thereby reduce static power consumption.

The foregoing circuit topologies and scalable methods for folding SRAM, DRAM, or other volatile or non-volatile memory instances into two or more tiers 12A and 12B thus enable different timing and power function, which may be provided in liberty files for memory access in the different tiers 12A and 12B. The separate memory self-time paths for each tier 12A and 12B may also enable associated control methodologies for timing a memory operation in the 3D storage circuits 10, 10A, and 10B described above.

Such a method may include providing a storage array 15 on two or more tiers 12A and 1B of semiconductor dies to form a plurality of storage subarrays 15A and 15B, with a given one of the storage subarrays 15A or 15B being arranged on a respective one of the tiers 12A or 12B. The method may include coupling a timing circuit 14 to respective row and column replica tracking cells 18A-R, 18A-C, 18B-R, and 18B-C on each of the tiers 12A or 12B. In response to receipt of a clock signal CLK, a possible tier address signal when a single local clock generator 24 is shared by the tiers 12A and 12B, and a respective set of tier-specific trim bits (arrow TB-0, TB-1) for each of the tiers 12A or 12B, the method may include independently controlling a state of each of the tiers 12A and 12B during an access operation of the 3D storage circuit 10, 10A, or 10B. Such timing occurs via the timing circuit 14 in a manner that accounts for predetermined inter-tier process and/or thermal variations.

The method may optionally include identifying one of the storage subarrays 15A or 15B being accessed during the memory operation as an identified storage subarray, and then selectively boosting or collapsing a corresponding local voltage supply of the identified storage subarray 15A or 15B via at least some of the tier-specific trim bits (TB-0 or TB-1) as explained above with reference to the several Figures. Such trim bits may also be used to independently transition one of the tiers to a low-power mode.

The present teachings provide tighter margins for each tier 12A and 12B, and may lead to optimal performance, power, and area (PPA). Tighter timing spreads enabled by the tier-specific trim bits (TB-0 and TB-1) in conjunction with the timing circuit 14 leads to improved performance, while minimizing extra bit line swing leads may improve dynamic power. The use of tracking cells 18A-C, 18A-R, 18B-C, and 18B-R enables a closer match of parasitics occurring on the actual word line and bit line used in each respective tier 12A and 12B. Additionally, transistors of the DBLPDN circuitry 21A and 21B on each tier 12A and 12B can more closely match any threshold shifts on the bitcell pulldown transistors in the same tiers 12A or 12B. Accurate modeling is also enabled for count and delay of the various 3D connections 35 as seen by the actual word line and bit line paths. These and other benefits will be readily appreciated by those of ordinary skill in the art and view of the foregoing disclosure.

In the present application and in the appended claims, the words "configured to . . . " mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not necessarily imply that the apparatus element needs to be changed in any way in order to provide the defined operation.

It should likewise be understood that, although the terms first, second, etc., are used herein to describe various elements, such elements are not limited by these descriptive terms. These terms are used herein to distinguish one element from another. For example, a first element could be termed a second element, and vice versa. The first element and the second element are both elements, respectively, but they are not to be considered the same element.

As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

While the best modes for carrying out the present disclosure have been described in detail, those familiar with the art to which this disclosure relates will recognize various alternative designs and embodiments for practicing the disclosure within the scope of the appended claims. Reference has been made in detail to various implementations, examples of which are illustrated in the accompanying drawings and Figures.

What is claimed is:

1. A three-dimensional (3D) storage circuit comprising:
two or more tiers of semiconductor dies;
a storage array having a plurality of bitcells arranged on the two or more tiers to thereby form a plurality of storage subarrays;
row and column replica tracking cells arranged on each of the tiers; and
a timing circuit coupled to the tracking cells of each of the tiers, wherein the timing circuit includes a local clock generator configured to generate a global tracking signal in response to an external clock signal, and to independently control a timing and/or voltage state of each of the tiers during an access operation of the 3D storage circuit in response to or using tier-specific trim bits for each respective one of the tiers, thereby accounting for predetermined inter-tier variations of the 3D storage circuit, the tier-specific trim bits including extra margin adjust (EMA) bits configured to control a rising or falling edge of the global tracking signal to thereby adjust a sense enable delay within the 3D storage circuit.

2. The 3D storage circuit of claim 1, wherein the timing circuit includes a single local clock generator shared by the two or more tiers.

3. The 3D storage circuit of claim 1, wherein the timing circuit includes a plurality of replica or dummy word line (DWL) drivers each configured to output a DWL signal to the tracking cells of a respective one of the tiers in response to the global tracking signal.

4. The 3D storage circuit of claim 1, wherein the local clock generator includes a plurality of local clock generators each arranged on a respective one of the tiers.

5. The 3D storage circuit of claim 1, further comprising, on each respective one of the tiers, corresponding replica or dummy bit line pulldown (DBLPDN) circuitry coupled to the tracking cells and configured to independently adjust a replica or dummy bit line voltage in a respective one of the tiers in response to at least some of the trim bits.

6. The 3D storage circuit of claim 1, wherein at least two of the storage subarrays have an unequal number of the bitcells.

7. The 3D storage circuit of claim 6, wherein a number of the bitcells of a given one of the storage subarrays arranged on an uppermost one of the two or more tiers exceeds a number of the bitcells of the storage subarrays of each remaining one of the tiers.

8. The 3D storage circuit of claim 1, wherein the trim bits include read-assist word line (RAWL) trim bits to control a word line voltage during a read/write cycle of the 3D storage circuit, and write-assist word line (WAWL) trim bits to control a word line voltage during a write cycle of the 3D storage circuit.

9. The 3D storage circuit of claim 1, wherein the 3D storage circuit is a 3D SRAM device.

10. A method for controlling timing of a memory operation in a three-dimensional (3D) storage circuit, the method comprising:
  providing a storage array of bitcells on two or more tiers of semiconductor dies to thereby form a plurality of storage subarrays, wherein one of the storage subarrays is arranged on a respective one of the tiers;
  providing a timing circuit coupled to respective row and column replica or dummy tracking cells on each of the tiers, the tracking cells of each of the tiers being driven by a respective replica or dummy word line (DWL) driver;
  recording a tier-specific set of trim bits in a non-volatile memory instance for each respective one of the tiers, the tier-specific set of trim bits including read-assist word line (RAWL) trim bits to control a word line voltage during a read/write cycle of the 3D storage circuit, and write-assist word line (WAWL) trim bits to control a word line voltage during a write cycle of the 3D storage circuit; and
  in response to receipt of a clock signal, independently controlling a timing and/or voltage state of each of the tiers via the tier-specific set of trim bits during an access operation of the 3D storage circuit, via the timing circuit, to thereby account for predetermined inter-tier variations.

11. The method of claim 10, further comprising:
  generating a global tracking signal via at least one local clock generator of the timing circuit in response to the clock signal; and
  selectively outputting a replica or dummy word line (DWL) signal to the tracking cells of the tiers using the respective DWL driver in response to the global tracking signal.

12. The method of claim 11, wherein the timing circuit includes an N:1 demultiplexer in which N is a number of the tiers, the method further comprising using a dummy bit line output of the N:1 demultiplexer as an input to the local clock generator.

13. The method of claim 12, wherein the local clock generator includes a plurality of local clock generators, and wherein generating the global tracking signal is generated on each of the tiers using a respective one of the local clock generator.

14. The method of claim 11, further comprising:
  independently modifying a bit line voltage in response to at least some of the trim bits using respective replica or dummy bit line pulldown circuitry coupled to the tracking cells.

15. The method of claim 11, wherein the tier-specific trim bits include extra margin adjust (EMA) bits configured to control a rising or falling edge of the global tracking signal, and to thereby adjust a sense enable delay within the 3D storage circuit.

16. The method of claim 10, wherein the 3D storage circuit is a 3D SRAM device.

17. A three-dimensional (3D) storage circuit comprising:
  control circuitry having an external clock configured to generate a clock signal, wherein the control circuitry is configured to provide a tier address signal and first and second sets of trim bits;
  a first semiconductor die forming a first tier of the 3D storage circuit, and having a first array of bitcells and respective first sets of column and row replica or dummy tracking cells controllable via the first set of trim bits;
  a second semiconductor die coupled to the first semiconductor die via 3D connections, forming a second tier of the 3D storage circuit, and having a second array of bitcells and respective second sets of column and row of replica or dummy tracking cells controllable via the second set of trim bits; and
  a timing circuit coupled to the control circuitry and/or to the replica tracking cells of each of the tiers, wherein the timing circuit is configured to generate a global tracking signal in response to a rising edge of the clock signal, and in response to the tier address signal and the global tracking signal, to selectively output a replica or dummy word line signal to the tracking cells of each of the tiers using the timing circuit;
  wherein the timing circuit is configured to use extra margin adjust (EMA) trim bits as at least some of the first and second sets of trim bits to control a rising or falling edge of the global tracking signal to thereby adjust a sense enable delay within the 3D storage circuit, and to independently modify a bit line voltage of the tiers in response to at least some additional trim bits of the first and second sets of trim bits to thereby control a timing and/or voltage state of each of the tiers during an access operation of the 3D storage circuit, and to thereby account for predetermined inter-tier variations.

18. The 3D storage circuit of claim 17, wherein the first and second sets of trim bits further include read-assist word line (RAWL) trim bits to control a word line voltage during a read/write cycle of the 3D storage circuit, and write-assist word line (WAWL) trim bits to control a word line voltage during a write cycle of the 3D storage circuit.

19. The 3D storage circuit of claim 17, wherein the 3D storage circuit is a 3D SRAM device.

* * * * *